(12) United States Patent
Grau et al.

(10) Patent No.: US 11,989,491 B2
(45) Date of Patent: *May 21, 2024

(54) GENERATIVE SHELL DESIGN FOR SIMULATIONS

(71) Applicant: Autodesk, Inc., San Francisco, CA (US)

(72) Inventors: Michael Grau, Birmingham, MI (US); Andrew John Harris, London (GB)

(73) Assignee: AUTODESK, INC., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/933,701

(22) Filed: Sep. 20, 2022

(65) Prior Publication Data

US 2023/0021239 A1 Jan. 19, 2023

Related U.S. Application Data

(63) Continuation of application No. 16/747,816, filed on Jan. 21, 2020, now Pat. No. 11,449,647.

(51) Int. Cl.
*G06F 30/15* (2020.01)
*G06F 30/12* (2020.01)
(Continued)

(52) U.S. Cl.
CPC .............. *G06F 30/15* (2020.01); *G06F 30/12* (2020.01); *B33Y 10/00* (2014.12); *B33Y 50/00* (2014.12);
(Continued)

(58) Field of Classification Search
CPC .......... G06F 30/15; G06F 30/12; G06F 30/20; G06F 30/23; G06F 30/00; G06F 30/17;
(Continued)

(56) References Cited

U.S. PATENT DOCUMENTS 6,704,693 B1 3/2004 Fan et al.
11,295,041 B2 4/2022 Cramer et al.
(Continued)

OTHER PUBLICATIONS

Y. Tang, A. Kurtz, Y. F. Zhao, "Bidirectional Evolutionary Structural Optimization (BESO) based design method for lattice structure to be fabricated by additive manufacturing" 2015, pp. 91-101 (Year: 2015).*

(Continued)

*Primary Examiner* — Kibrom K Gebresilassie
(74) *Attorney, Agent, or Firm* — Gates & Cooper LLP

(57) ABSTRACT

A method and system provide the ability to generate models. A generative shelled base is created as a hollow computer-aided design (CAD) design. A t-spline mid-surface shell is created from the generative shelled base, which is then used to create a shell mesh model. A t-spline solid body is created from the generative shelled base, which is used to create an internal support structure that is converted into a shell CAD geometry, which is used to create a support structure mid-surface shell. The support structure mid-surface shell is combined with the shell mesh model into a generative mid-surface mesh that is used in a computer-aided engineering (CAE) crash simulation. The generated shelled base is combined with the shell CAD geometry into a generative shelled solid that is utilized in an additive build simulation.

18 Claims, 11 Drawing Sheets

(51) Int. Cl.
  *B33Y 10/00* (2015.01)
  *B33Y 50/00* (2015.01)
  *G05B 19/4099* (2006.01)
  *G06F 30/00* (2020.01)
  *G06F 30/17* (2020.01)
  *G06F 30/20* (2020.01)
  *G06F 30/23* (2020.01)
  *G06T 17/20* (2006.01)

(52) U.S. Cl.
  CPC .......... *G05B 19/4099* (2013.01); *G06F 30/00* (2020.01); *G06F 30/17* (2020.01); *G06F 30/20* (2020.01); *G06F 30/23* (2020.01); *G06T 17/20* (2013.01)

(58) Field of Classification Search
  CPC .... B33Y 10/00; B33Y 50/00; G05B 19/4099; G06T 17/20
  See application file for complete search history.

(56) References Cited

U.S. PATENT DOCUMENTS

| | | | |
|---|---|---|---|
| 2009/0024370 A1 | 1/2009 | Scott et al. | |
| 2014/0005986 A1* | 1/2014 | Aish | G06F 30/13 703/1 |
| 2014/0160121 A1* | 6/2014 | Johansson | G06T 15/40 345/420 |
| 2017/0372480 A1 | 12/2017 | Anand et al. | |
| 2018/0240263 A1 | 8/2018 | Courter et al. | |
| 2019/0130058 A1 | 5/2019 | Thomas | |
| 2020/0074028 A1 | 3/2020 | Yang et al. | |
| 2020/0151286 A1 | 5/2020 | Willis et al. | |
| 2021/0294300 A1 | 9/2021 | Grau et al. | |
| 2021/0327138 A1 | 10/2021 | Perry et al. | |
| 2021/0331265 A1 | 10/2021 | Zhang et al. | |
| 2021/0331789 A1 | 10/2021 | Wardlaw | |

OTHER PUBLICATIONS

D.P.Sheen, T.G. Son, D.K.Myung, C. Ryu, S.H.Lee, T.J.Yeo, "Transformation of a thin-walled solid model into surface model via solid deflation" 2010, pp. 720-730 (Year: 2010).*

"3D Printing", Wikipedia, as downloaded Jan. 8, 2020, pp. 1-16, https://en.wikipedia.org/wiki/3D_printing.

"Crash simulation", Wikipedia, as downloaded Jan. 3, 2020, pp. 1-5, https://en.wikipedia.org/wiki/Crash_simulation.

"Design for additive manufacturing", Wikipedia, as downloaded Jan. 8, 2020, pp. 1-3, https://en.wikipedia.org/wiki/Design_for_additive_manufacturing.

"Generative Design", Autodesk, as downloaded Jan. 3, 2020, pp. 1-2, https://www.autodesk.com/solutions/generative-design.

Broekaart, D., "5 reasons why you should use a mid-surface shell mesh for thin-walled parts", SIMULEON, Sep. 2016, pp. 1-12, https://info.simulation-blog.technia.com/simulation/5-reasons-why-your-fea-simulations-should-be-setup-with-a-mid-surface-shell-mesh-for-thin-walled-parts.

Cipriani, L, et al., "3D Models Mapping Optimization Through an Integrated Parameterization Approach: Cases Studies From Ravenna", the International Archives of the Photogrammetry, Remote Sensing and Spatial Information Sciences, 2014, pp. 173-180, vol. XL-5, ISPRS Technical Commission V Symposium, Riva del Garda, Italy.

Muelaner, J.,"Implicit modelling for complex geometry", https://www.3dcadworld.com/implicit-modelling-for-complex-geometry/, pp. 1-23, 2020, as downloaded Mar. 8, 2021.

Pura, J., "Introduction—Midsurface Geometry and Meshing for FEA with MSC Apex", Hexagon, MSC Software, Jun. 2019, pp. 1-4, https://simulatemore.mscsoftware.com/introduction-midsurface-geometry-and-meshing-for-fea-with-msc-apex/, as downloaded Mar. 20, 2020.

Schertler, N., et al., "Generalized Motorcycle Graphs for Imperfect Quad-Dominant Meshes", ACM Transactions on Graphics, Aug. 2018, vol. 37, No. 4, Article 155.

U.S. Appl. No. 17/203,524.

* cited by examiner

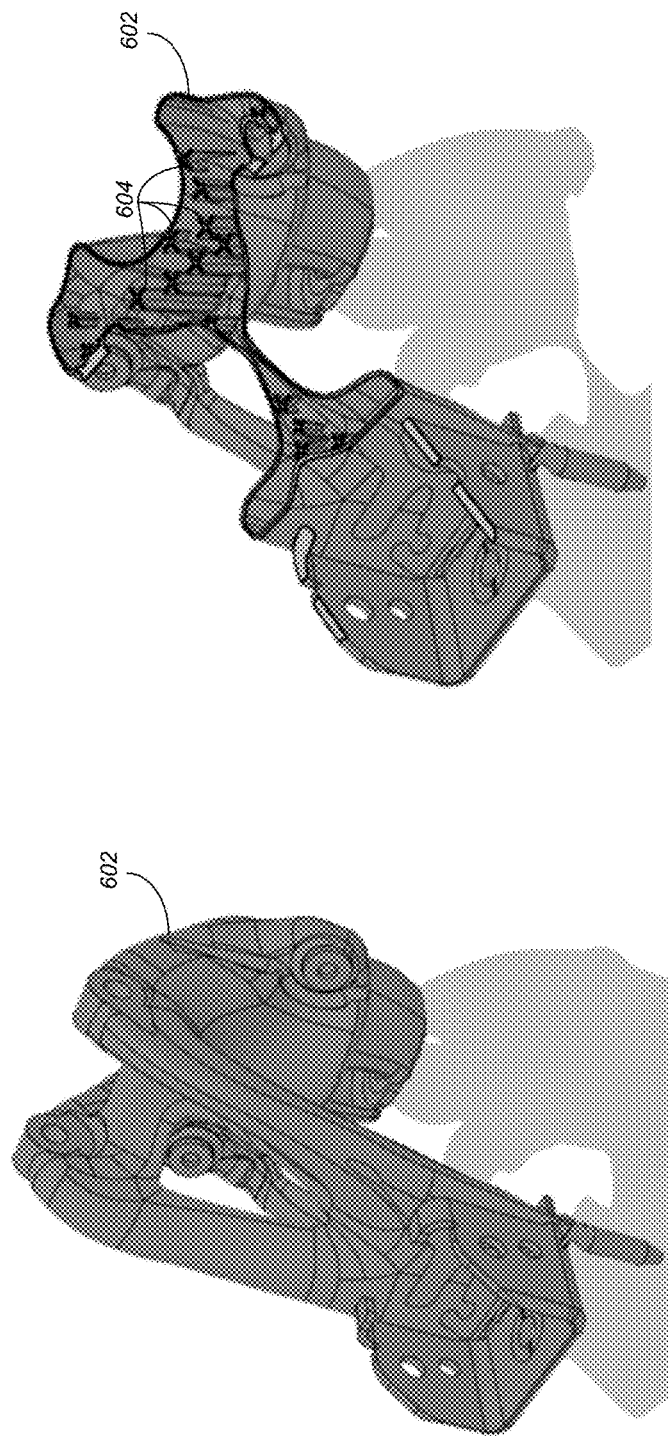
FIG. 6B
FIG. 6A
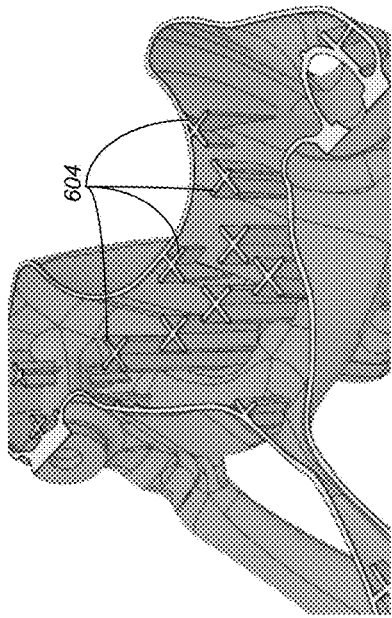
FIG. 6C

GENERATIVE SHELL DESIGN FOR SIMULATIONS

CROSS-REFERENCE TO RELATED APPLICATIONS

This application is a continuation under 35 U.S.C. § 120 of application Ser. No. 16/747,816, filed on Jan. 21, 2020, (now U.S. Pat. No. 11,449,647 issued on Sep. 20, 2022) with inventor(s) Michael Grau and Andrew John Harris, entitled "Generative Shell Design for Simulations,", which application is incorporated by reference herein.

BACKGROUND OF THE INVENTION

1. Field of the Invention

The present invention relates generally to generative design and crash simulations, and in particular, to a method, apparatus, system, and article of manufacture for constructing an additive build generative design that can be used in a crash simulation in an efficient and cost-effective manner.

2. Description of the Related Art

A crash simulation is a virtual re-creation of a destructive crash test of a car or a highway guard rail system using a computer simulation in order to examine the level of safety of the car and its occupants. Crash simulations are used by automakers during computer-aided engineering (CAE) analysis for crashworthiness in the computer-aided design (CAD) process of modelling new cars and/or parts of cars. The CAE crash simulation process often includes executing the simulation/testing using multiple variations of a particular product/element of a vehicle. To provide the multiple variations, the generative design process may be used. Generative design is a design exploration process where generative design software generates multiple design alternatives (based on input [e.g., design goals and parameters] from designers/engineers). Thus, rather than generating a single solution, multiple solutions are generated for a designer/engineer to select and test. Thus, each of the different generative design solutions may be used in a crash simulation as part of the testing process.

An additional aspect to the design process is that it is desirable to use an additive manufacturing process (e.g., three-dimensional [3D] printing) where a 3D object is built from a CAD model, by successively adding material layer by layer (unlike conventional machining, casting, and forging processes, where material may be removed from a stock item [subtractive manufacturing] or poured into a mold and shaped by means of dies, presses and hammers). When designing for additive manufacturing, the functional performance and/or other key product life-cycle considerations such as manufacturability, reliability, and cost are optimized subject to the capabilities of additive manufacturing technologies. In this regard, the additive design process may also be integrated into the generative design and CAE crash testing/simulation process.

One exemplary product that is designed using an additive generative design and tested using CAE crash testing, is that of a seat bracket. FIG. 1 illustrates an exemplary seat bracket 100 where the force is tracked over time based on load and constraint points 102A-112A in a system level crash system. FIG. 2 illustrates the tracked forces 102B-112B (reflecting the loads on the different constraint points 102A-112A of FIG. 1) over time in multiple load cases for a linear static level set optimization.

In a generative design for the seat bracket 100, a solid state steel design may be generated. Based on the solid state design, a mesh is created for use in the CAE crash simulation process. However, such a solid state design is heavy and too stiff. Further, the solid mesh ends up including approximately 1,500,000 elements—which is unwieldy and computationally expensive to use. Accordingly, it is desirable to gain more performance out of the generative designs while enabling the ability to quickly and easily perform CAE crash simulations.

In view of the above, the prior art is problematic in that there is no efficient and easy mechanism to produce a generative design that is better performing than a solid state design while simultaneously providing a CAD design that can be simulated in a CAE crash and build simulation.

SUMMARY OF THE INVENTION

Embodiments of the invention overcome the problems of the prior art using a lightweight shelled generative design. Specifically, a shelled generated design with an internal support structure is utilized that does not trap powder and does not create any re-coater interference. In addition, the shelled generative design can be used in both an additive build simulation as well as a vehicle crash simulation with shell elements without a major impact on simulation run time (time step) or mass scaling. The workflow for developing the lightweight shelled generative design includes an objective of having a representative CAD part of the shelled generative design with internal support as well as the associative CAE crash simulation model twin. In this regard, the workflow allows users not only to design light weight parts in a generative design process, but also allows users to simulate and validate their designs.

BRIEF DESCRIPTION OF THE DRAWINGS

Referring now to the drawings in which like reference numbers represent corresponding parts throughout:

FIG. 6A illustrates a shelled t-spline solid body in accordance with one or more embodiments of the invention;

FIG. 6B illustrates a cross-section of a shelled t-spline solid body with internal cross support structures in accordance with one or more embodiments of the invention;

FIG. 6C illustrates a close-up view of the internal cross-support structures in accordance with one or more embodiments of the invention;

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Logical Flow

Figure 1:
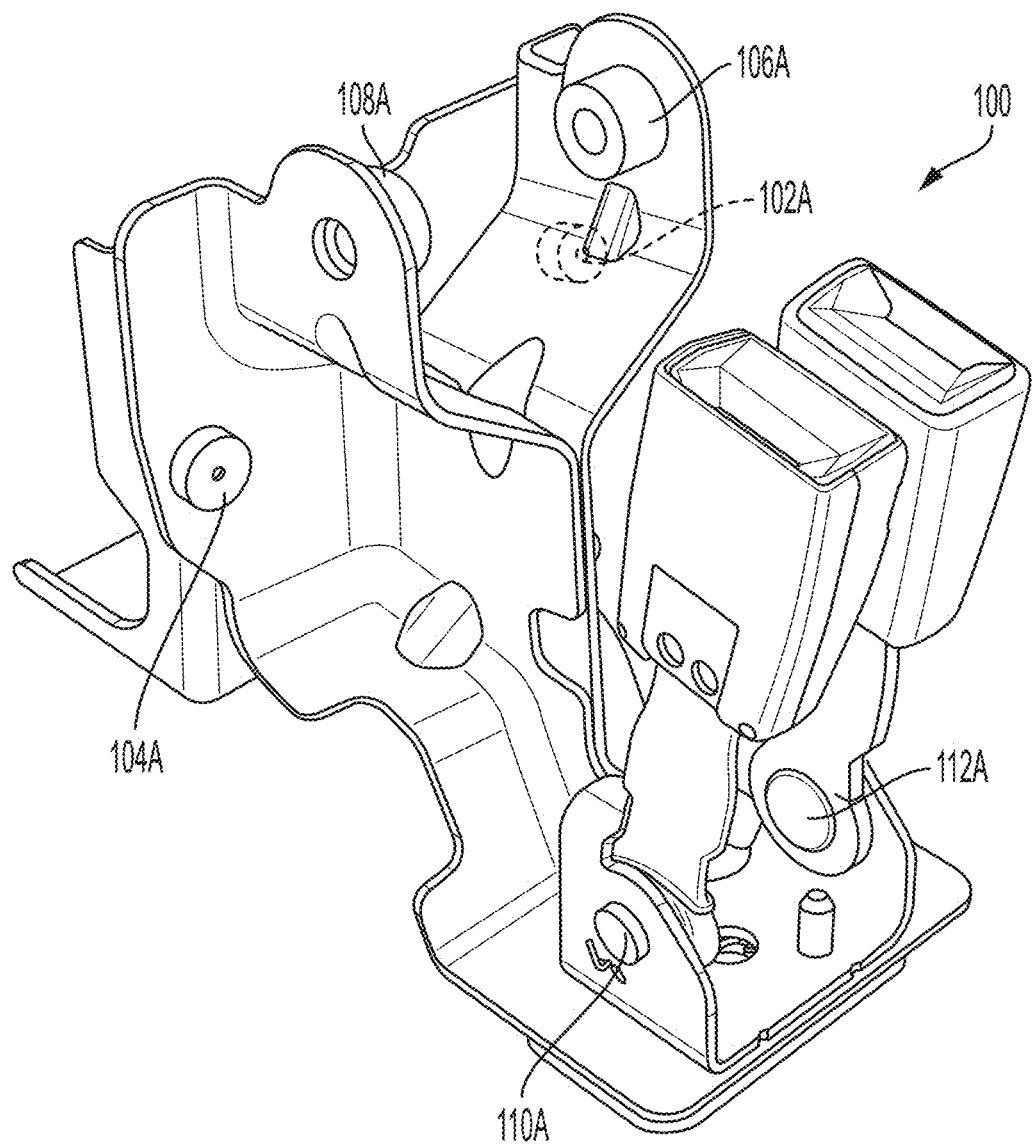
FIG. 1 illustrates an exemplary seat bracket where the force is tracked over time based on load and constraint points in a system level crash system.
Figure 2:
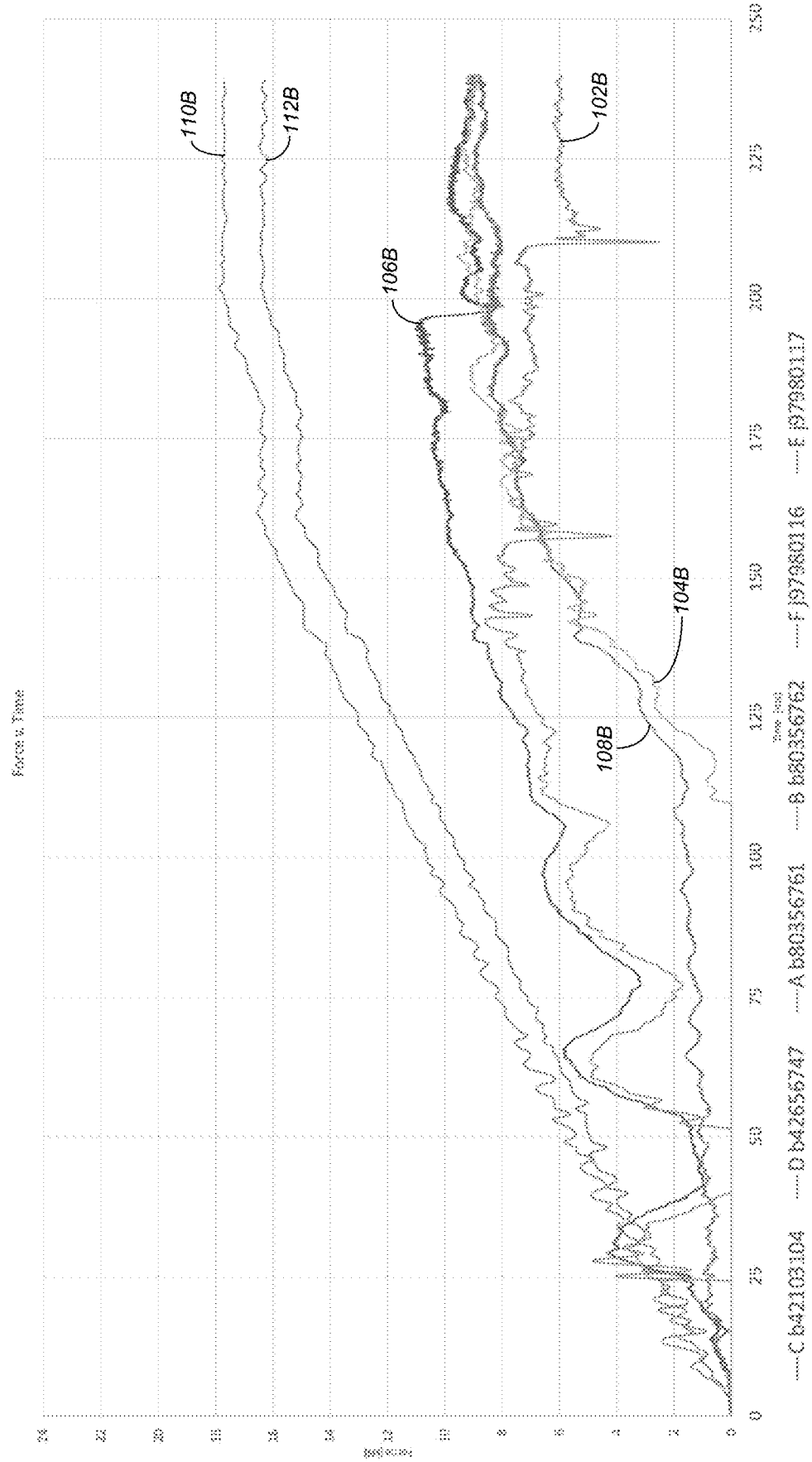
FIG. 2 illustrates the tracked forces on the seat bracket of FIG. 1 over time in multiple load cases for a linear static level set optimization.
Figure 3:
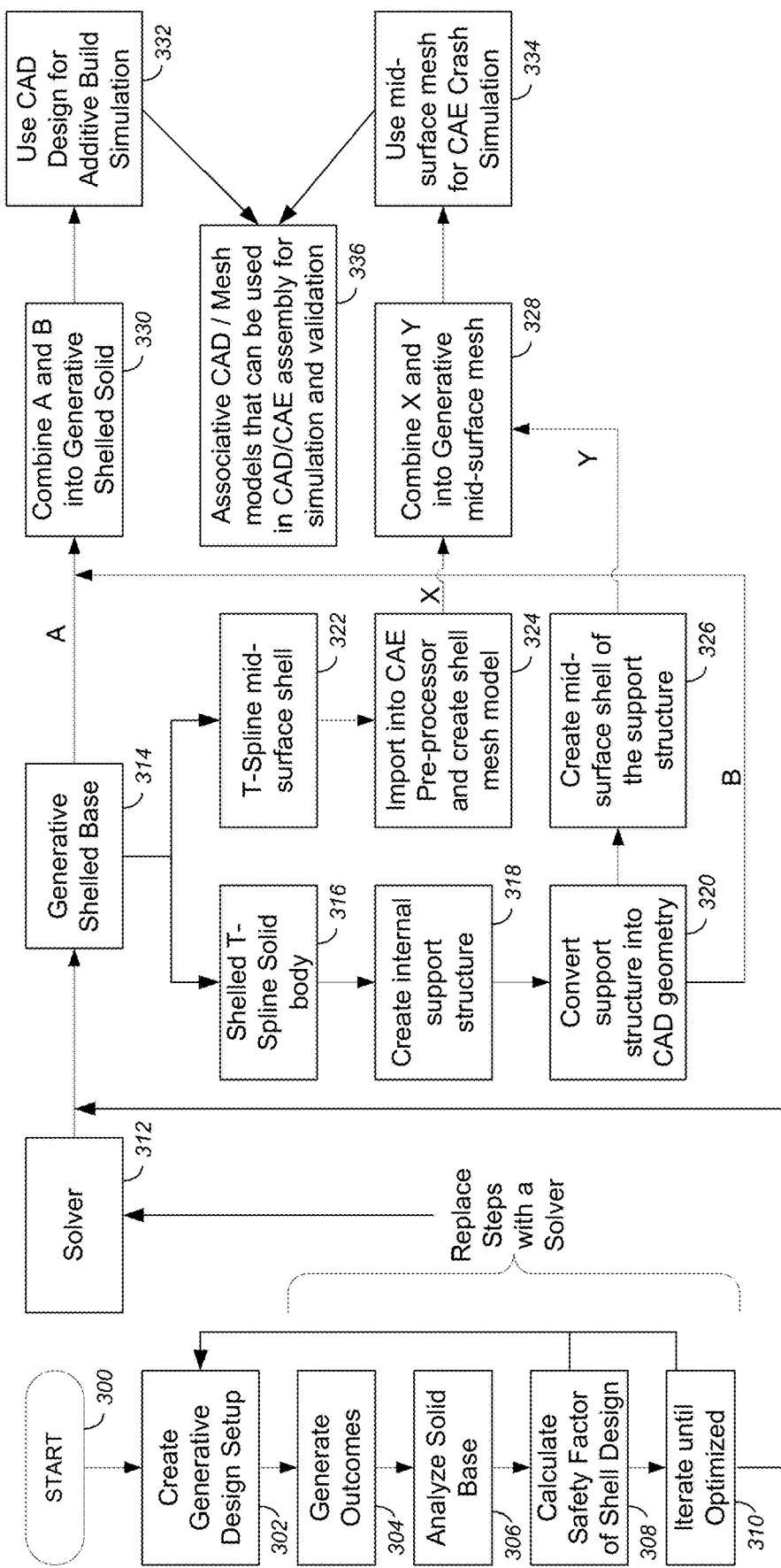
FIG. 3 illustrates the logical flow for creating a generative shell design that can be used for additive design and a crash simulation in accordance with one or more embodiments of the invention.

FIG. 3 illustrates the logical flow for creating a generative shell design that can be used for additive design and a crash simulation in accordance with one or more embodiments of the invention.

Figure 4A:
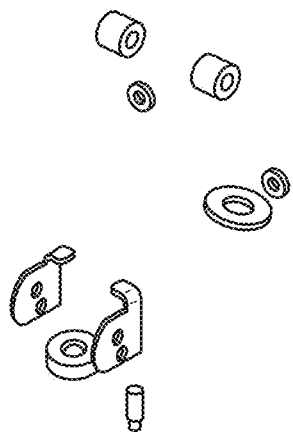
FIGS. 4A-4C illustrate three exemplary parameters that may be defined for the generative design setup in accordance with one or more embodiments o the invention.
Figure 4B:
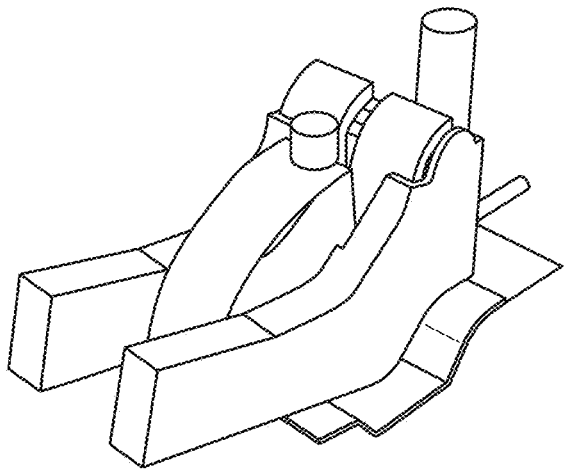
Figure 4C:
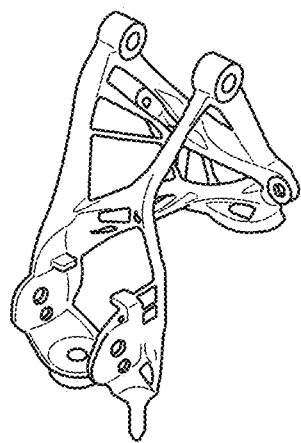

The process starts at 300 and a generative design is set up in step 302. More specifically, in step 302, a generative design file may be setup (e.g., including obstacles, boundary conditions, constraints, etc.) (e.g., in a cloud-based product development platform that connects 3D CAD, CAM, and CAE tools such as the FUSION 360 platform available from the assignee of the present application; the FUSION 360 platform provide the ability to perform 3D design and modeling, simulation generative design, documentation, collaboration, and manufacturing). FIGS. 4A-4C illustrate three exemplary parameters that may be defined for the generative design setup in accordance with one or more embodiments o the invention. FIG. 4A illustrates preserved regions that are specified, FIG. 4B illustrates obstacle regions, and FIG. 4C illustrates a starting shape that has been defined/setup. Accordingly, creating the generative design for a solid CAD design at step 302 may include creating obstacles and applying boundary conditions with constraints.

Figure 4D:
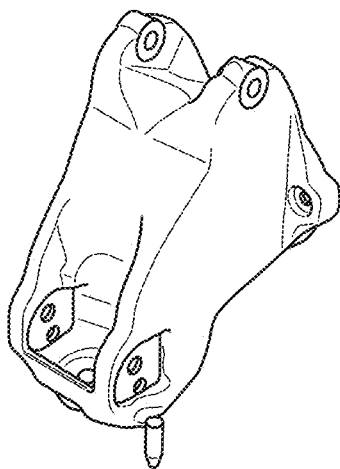
FIG. 4D illustrates an exemplary converged outcome pursuant to FIGS. 4A-4C in accordance with one or more embodiments of the invention.

At step 304, outcomes with a chosen material are generated until convergence is reached. Exemplary settings used during the outcome generation process may include an objective to minimize mass, a safety factor limit of 1.0, and unrestricted manufacturing. FIG. 4D illustrates an exemplary converged outcome. In this regard, the converged outcome may represent a recipe for a component body that has a history/timeline that can be accessed. The history may consist of a T-spline body and a Boolean operation that combines the t-spline body to a preserved region to create a solid body for a full volume. Accordingly, the outcomes generated at step 304 are historical recipes for creating the generative design and are based on stress forces that are applied to the generative design. The last iteration of the converged outcome may be exported and used in subsequent steps.

At step 306, the solid base outcome from step 304 is analyzed. Such an analysis may include editing the recipe/timeline and manually editing the t-spline (and/or adding a [new] t-spline). In this regard, a stress analysis or other type of analysis may be performed on the converged solid body.

At step 308, a safety factor may be adjusted/recalculated and used to calculate a shell (also referred to as a hollow design) of the solid body (e.g., based on the historical recipe). Such a shell design and shelled body may be converted to a shell mesh and used to run shell mesh analyzers in a simulation tool. Accordingly, step 308 includes determining/calculating a safety factor for a shell/shell design. In this regard, one mechanism for creating a shell design is to increase a size of a particular section—increasing the safety factor is an understood technique for increasing the section size. The safety factor may be fed back into the generative design process (e.g., back to step 302). Accordingly, step 310 includes iterating (e.g., as part of a generative design process) and generating a shell with varying safety factors until optimized (i.e., until an optimized generative shelled base is acquired). The eventual ideal shell generated/exported from step 310 is to have a design with an optimized uniform thickness.

Various techniques may be used at step 308 to calculate the safety factor including utilizing various spreadsheets that may include various equations based on inertia safety factor theory which in turn is based on a rectangular solid and a rectangular shelled design. In this regard, a safety factor analysis may process two input entities—(1) a base diameter of a solid section, and (2) a minimum wall thickness of a hollow design. Based on the input entities, the safety factor analysis computes round solid and round shelled section sizes. In one or more embodiments, a spreadsheet may be converted into a database that is connected to a modeling AddIn/Script. Alternatively, a calculator may be utilized.

In view of the above, the converged outcome from step 304 is sued to calculate a safety factor for another generative design (e.g., using a spreadsheet/calculator and various calculations) at step 308. At step 310, outcomes with a chosen material and safety factor (calculated at step 308) are generated until convergence. As noted in FIG. 3, steps 304-310 may be replaced by a solver 312 that generates optimized shelled bodies in a uniform thickness (e.g., that generates a t-spline of the generative shelled base). The chosen iteration is then exported as the generative shelled base 314.

Consequently, the result from steps 302-312 is a 2D element model that has an optimized uniform thickness (i.e., a generative shelled base design 314—which may consist of a generative design with a t-spline). In this regard, the generative shelled base is a generatively generated and is a hollow computer-aided design (CAD) design. The generative shelled base design 314 is converted into a shelled t-spline solid body 316 and t-spline mid-surface shell 322.

Figure 5A:
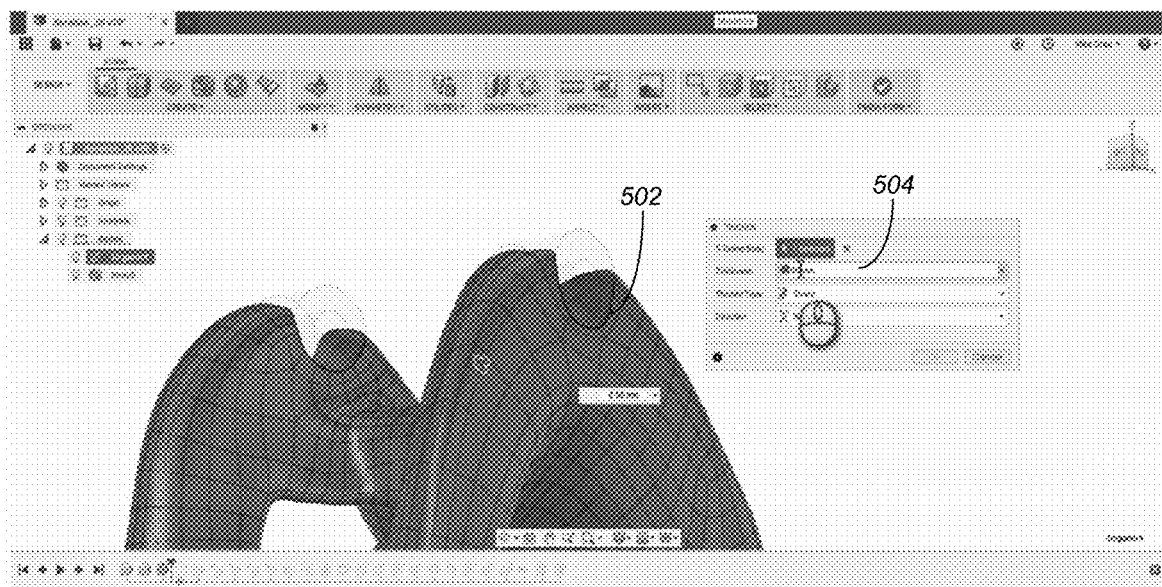
FIG. 5A illustrates the outer t-spline face prior to an offset/thickening operation of one or more embodiments of the invention.
Figure 5B:
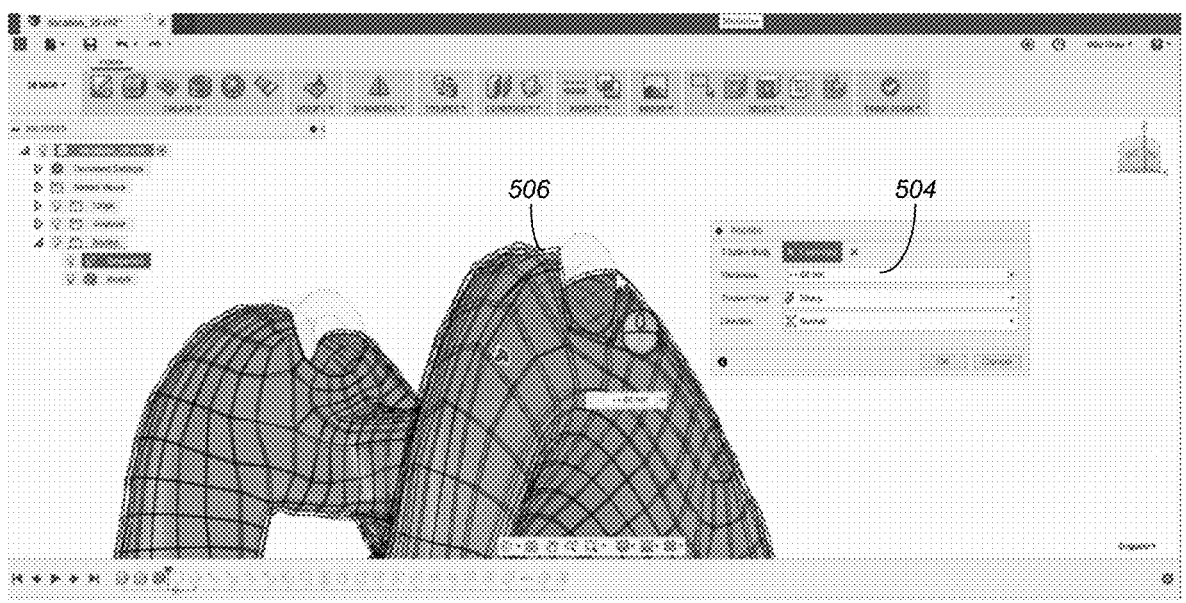
FIG. 5B illustrates an offset outer t-spline face after an offset/thickening operation in accordance with one or more embodiments of the invention.

The shelled t-spline solid body 316 can be generated using a variety of mechanisms. In one or more embodiments, the shelled t-spline solid body 316 may be generated by first acquiring an outer t-spline face from the generative shelled base and then offsetting the outer t-spline face (from the generative shelled base 314) by a defined amount/thickness/threshold (e.g., 1 mm) to create an inner surface for a solid shell (e.g., 1 mm) (hollow CAD) design (e.g., resulting in the t-spline solid body). FIG. 5A illustrates the outer t-spline face 502 prior to an offset/thickening operation (i.e., the thickness 504 is 0 mm). FIG. 5B illustrates an offset outer t-spline face 506 after an offset/thickening operation (i.e., the thickness 504 is 1 mm) in accordance with one or more embodiments of the invention.

At step 318, within a product development workflow application (e.g., the FUSION 360 platform or the NETFABB application), internal support structures that are additive are created in the solid shell/shelled t-spline solid body 316. In step 318, such internal support structures may be created via a mesh. In one or more embodiments of the invention, the internal support structures are internal cross-support structures. Such support structures are light weight internal support, do not trap powder, may be created in a full CAD design, and a cross-shaped cross-section provides greater inertia (e.g., against bending). In this regard, other internal support structures (e.g., of a different design) may trap powder. FIG. 6A illustrates a shelled t-spline solid body 602. FIG. 6B illustrates a cross-section of a shelled t-spline solid body 602 with the internal cross support structures 604. FIG. 6C illustrates a close-up view of the internal cross-support structures 604 in accordance with one or more embodiments of the invention.

At step 320, the internal cross-support structures 604 are converted into CAD geometry. In this regard, once you have the internal support structures at step 318 in a mesh form, the mesh needs to be converted into CAD geometry (e.g., a shell CAD geometry). In one or more embodiments, step 320 includes exporting the CAD faces of the internal support structures (e.g., into a STEP standard—"Standard for the Exchange of Product model data"). More specifically, the internal support structures are converted into a solid representation (e.g., CAD faces and solid bodies) that can be combined (e.g., via a Boolean operation) onto the generative shelled base 314 to create a generative shelled solid 330 for use in an additive build simulation 332.

At step 322, the generative shelled base 314 is converted into a t-spline mid-surface shell 324. To perform the conversion, the outer t-spline face (e.g., from generative shelled base 314) may be offset by a defined amount/thickness, threshold (e.g., 0.5 mm) to create a shelled mid-surface 324 (e.g., an inner surface) resulting in the t-spline mid-surface shell. Such an offset for an outer t-spline face may be implemented using a "thicken" command/operation, for example (as described above).

At step 324, the shelled mid-surface shell is imported into a CAE pre-processor to create a shell mesh model.

Figure 7A:
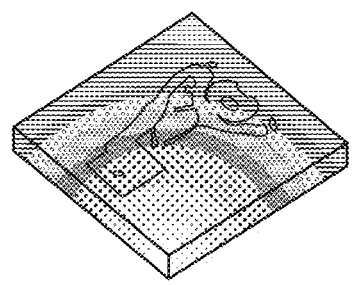
FIGS. 7A-7C illustrate an exemplary additive build simulation for a seat bracket in accordance with one or more embodiments of the invention.
Figure 7B:
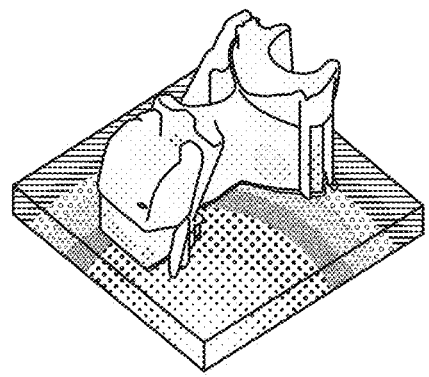
Figure 7C:
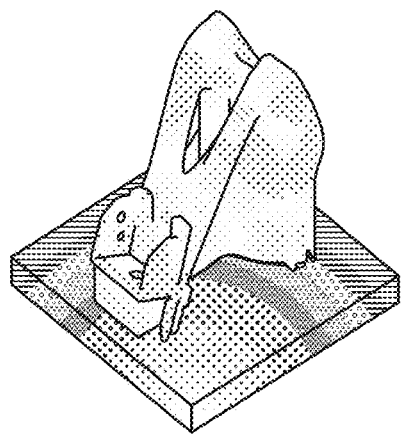

As described above, at step 330, the shell CAD geometry (from step 320) is combined (e.g., via a Boolean operation) with the generative shelled base (hollow CAD) 314 to create the generative shelled solid that can be used in an additive build simulation at 332. In this regard, the shelled t-spline solid body is combined with the internal support structure into one single CAD volume that can be exported into a simulation utility and optimized for an additive build process. Such an additive build simulation may include a thermal and non-linear static stress analysis (e.g., with no residual stress and a heat treatment applied). Due to the cross-shaped internal support structure, an exemplary seat bracket design provided no re-coater interference ad no trapped powder. FIGS. 7A-7C illustrate an exemplary additive build simulation for a seat bracket in accordance with one or more embodiments of the invention. The process starts at FIG. 7A and the additive build proceeds with the hollow internal-cross sections in FIG. 7B and the simulation is complete in FIG. 7C.

Figure 8B:
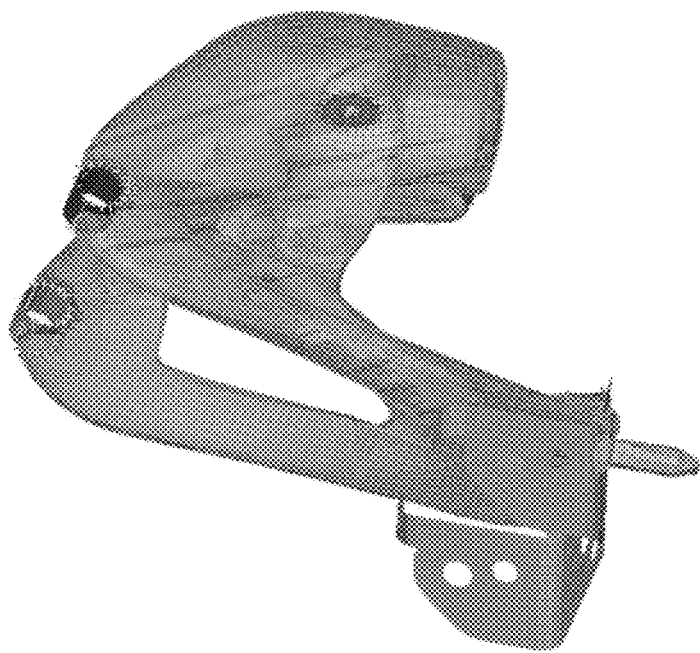
FIG. 8B illustrates a mid-surface shell mesh generated in accordance with one or more embodiments of the invention.
Figure 8A:
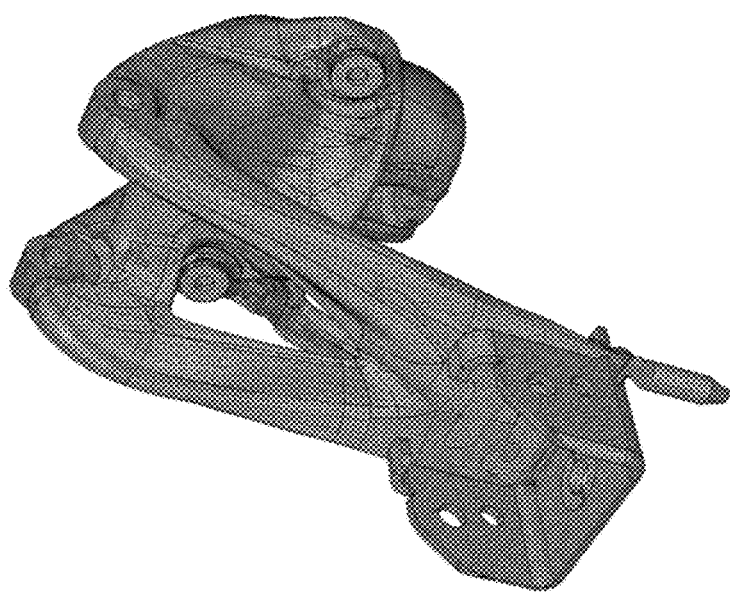
FIG. 8A illustrates an old solid mesh that was used in the prior art.

In addition to steps 316-330, the CAD geometry (from step 320) may also be used to create a support structure mid-surface shell of the internal support structures at step 326. Thereafter, the shell mesh model from step 324 may be combined (e.g., via a Boolean operation) with the support structure mid-surface shell of the support structure 326 to create a generative mid-surface mesh at step 328. In this regard, mesh elements may be used to build a quad shell mesh model for CAE crash and NVH (noise, vibration, and harshness) model requirements for virtual validation/simulation. In one or more embodiments, this combination at step 328 includes intersecting the internal support structure with a face of the shell mesh mode followed by deleting a portion of the internal support structure that extends beyond the face. FIG. 8A illustrates an old solid mesh that was used in the prior art that included approximately 1,500,000 elements. However, by performing steps 322-328 and utilizing the internal support structures, embodiments of the invention provide a new mid-surface shell mesh as illustrated in FIG. 8B that includes approximately 15,681 elements (i.e., almost 100 times reduction in the number of elements). The generative mid-surface mesh may then be used for a CAE crash simulation at step 334.

Figure 9:
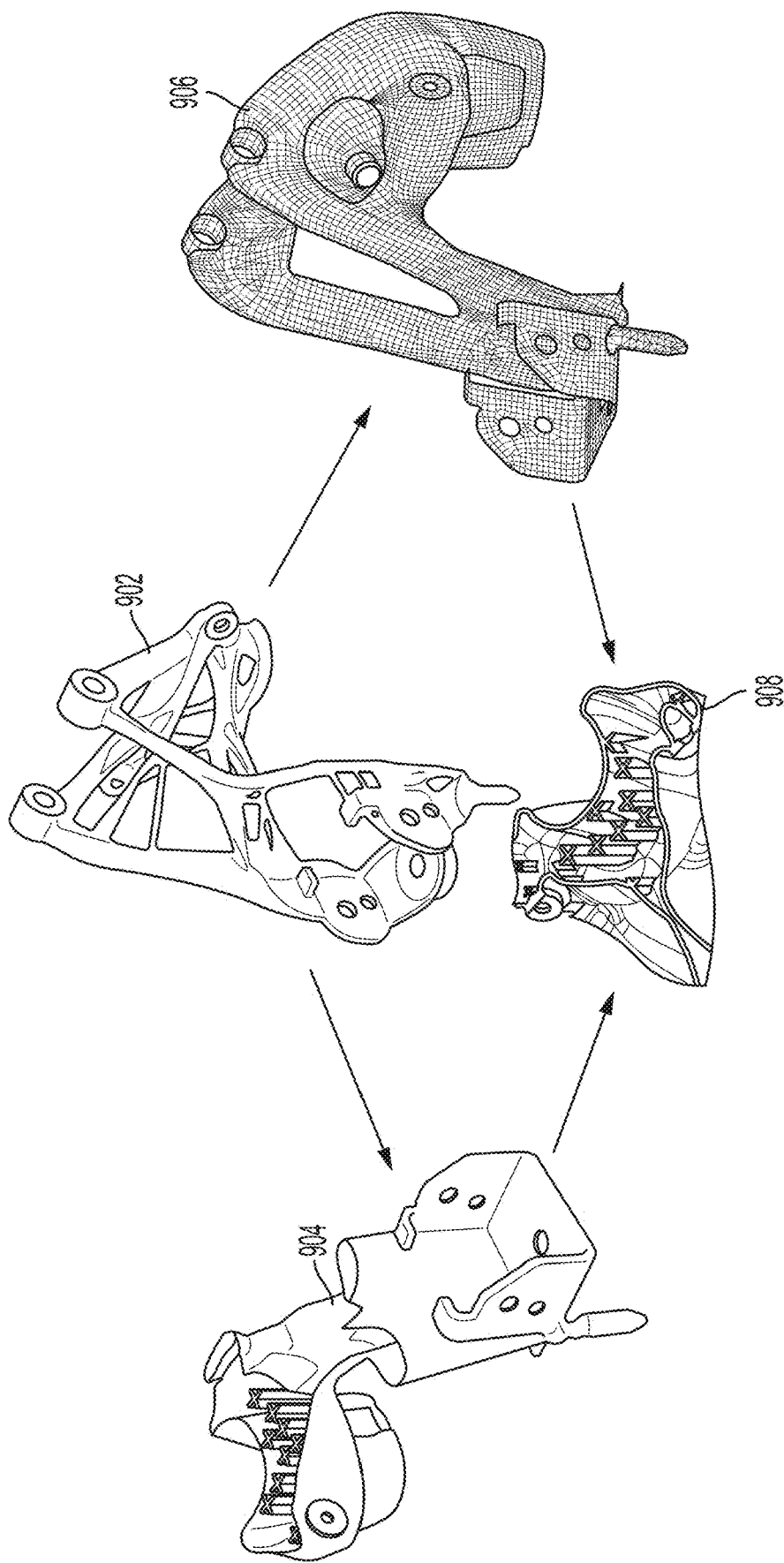
FIG. 9 illustrates images of exemplary seat bracket designs representative of the workflow in accordance with one or more embodiments of the invention.

In view of the above, at step 336, associative CAD/mesh models can be used in a CAD/CAE assembly for simulation and validation (e.g., an additive build simulation that is validated/tested via a CAE crash simulation). FIG. 9 illustrates images of exemplary seat bracket designs representative of the workflow in accordance with one or more embodiments of the invention. The generative CAD design 902 represents the generative shelled base 314 (and may be solid and can be used as a starting shape as well as a solid outcome of step 304 used in step 306). Via workflow steps 316-320 and 330, the generative shelled solid 904 is created and may be used in an additive build simulation 332. Similarly, via steps 322-328, a generative mid-surface mesh 906 is created that may be used in a CAE crash simulation 334. The interior of both the generative shelled solid 904 and generative mid-surface mesh 906 may be associated with each other and contain the internal support structures as seen in cross section 908.

Based on the workflow process and solution described herein, significant advantages over the prior art solutions result. One exemplary advantage of the generative and additive shell design is that of weight. In a prior art seat bracket design consisting of sheet metal made of structural steel, the weight was approximately 2.1 kg. With a seat bracket of a solid design made of stainless steel, a generative design solution was able to achieve a weight of 1.27 kg (40% lighter than the prior art design). However, based on the workflow process and solution of embodiments of the invention, a seat bracket additive shelled design was achieved and constructed from a $AlSi_{10}Mg$ material with a weight of 0.65 kg (70% lighter than the prior art design). In addition, the speed and efficiency for running the simulations due to the reduction in the number of mesh elements provides orders of magnitude less processing. Further, while the inertial force supported in the prior art sheet metal design is 12.1 kN, the inertial force supported in a solid design is 18.8 kN and in the shelled design is 13.1 kN.

Hardware Environment

Figure 10:
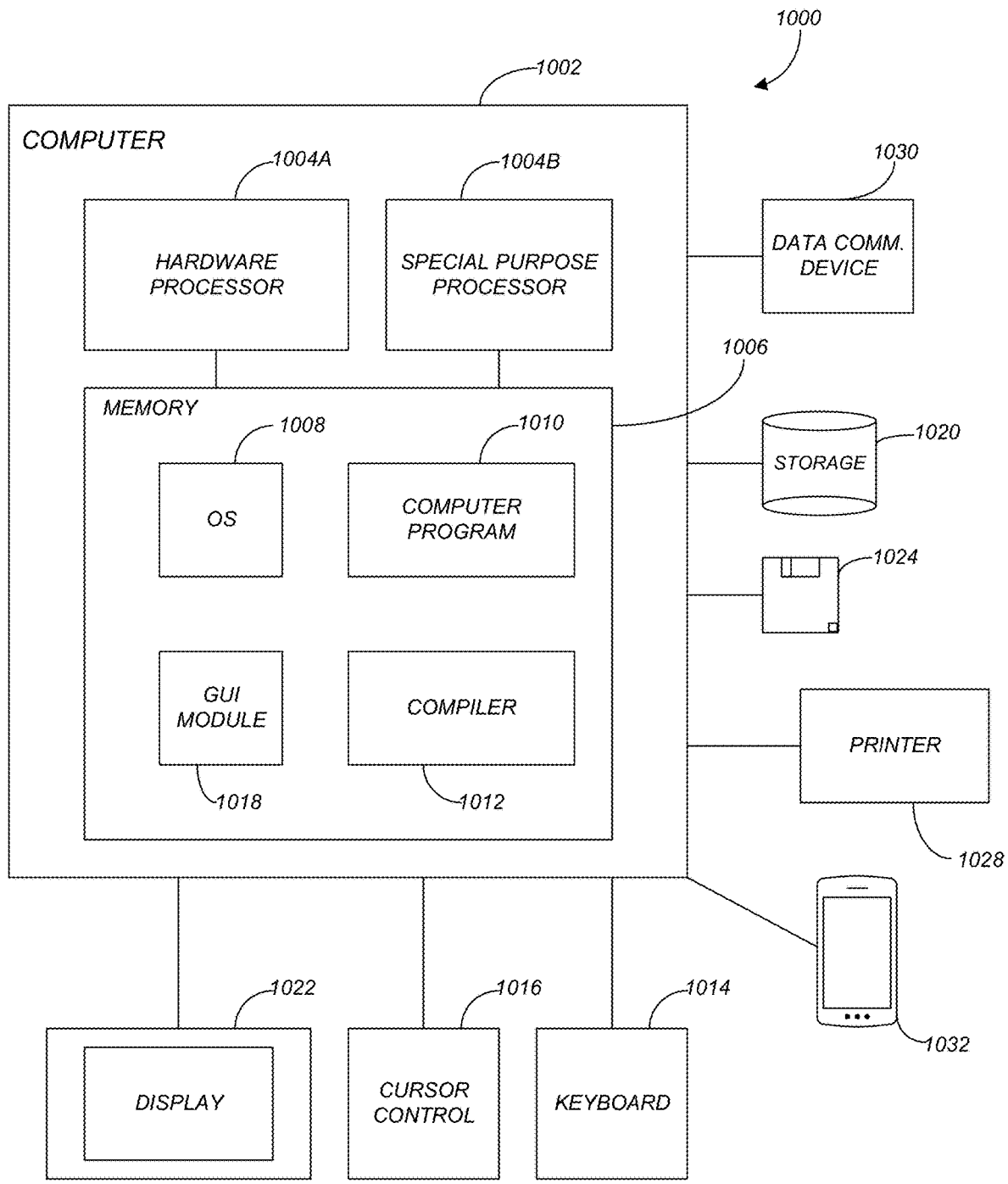
FIG. 10 is an exemplary hardware and software environment used to implement one or more embodiments of the invention.

FIG. 10 is an exemplary hardware and software environment 1000 (referred to as a computer-implemented system and/or computer-implemented method) used to implement one or more embodiments of the invention. The hardware and software environment includes a computer 1002 and may include peripherals. Computer 1002 may be a user/client computer, server computer, or may be a database computer. The computer 1002 comprises a hardware processor 1004A and/or a special purpose hardware processor 1004B (hereinafter alternatively collectively referred to as processor 1004) and a memory 1006, such as random access memory (RAM). The computer 1002 may be coupled to, and/or integrated with, other devices, including input/output (I/O) devices such as a keyboard 1014, a cursor control device 1016 (e.g., a mouse, a pointing device, pen and tablet, touch screen, multi-touch device, etc.) and a printer 1028. In one or more embodiments, computer 1002 may be coupled to, or may comprise, a portable or media viewing/listening device 1032 (e.g., an MP3 player, IPOD, NOOK, portable digital video player, cellular device, personal digital assistant, etc.). In yet another embodiment, the computer 1002 may comprise a multi-touch device, mobile phone, gaming system, internet enabled television, television set top box, or other internet enabled device executing on various platforms and operating systems.

In one embodiment, the computer 1002 operates by the hardware processor 1004A performing instructions defined by the computer program 1010 (e.g., a computer-aided design [CAD] application, a computer-aided engineering [CAE] application, an additive build simulator, and/or a CAE crash simulator) under control of an operating system 1008. The computer program 1010 and/or the operating system 1008 may be stored in the memory 1006 and may interface with the user and/or other devices to accept input and commands and, based on such input and commands and the instructions defined by the computer program 1010 and operating system 1008, to provide output and results.

Output/results may be presented on the display 1022 or provided to another device for presentation or further processing or action. In one embodiment, the display 1022 comprises a liquid crystal display (LCD) having a plurality of separately addressable liquid crystals. Alternatively, the display 1022 may comprise a light emitting diode (LED) display having clusters of red, green and blue diodes driven together to form full-color pixels. Each liquid crystal or pixel of the display 1022 changes to an opaque or translucent state to form a part of the image on the display in response to the data or information generated by the processor 1004 from the application of the instructions of the computer program 1010 and/or operating system 1008 to the input and commands. The image may be provided through a graphical user interface (GUI) module 1018. Although the GUI module 1018 is depicted as a separate module, the instructions performing the GUI functions can be resident or distributed in the operating system 1008, the computer program 1010, or implemented with special purpose memory and processors.

In one or more embodiments, the display 1022 is integrated with/into the computer 1002 and comprises a multi-touch device having a touch sensing surface (e.g., track pod or touch screen) with the ability to recognize the presence of two or more points of contact with the surface. Examples of multi-touch devices include mobile devices (e.g., IPHONE, NEXUS S, DROID devices, etc.), tablet computers (e.g., IPAD, HP TOUCHPAD, SURFACE Devices, etc.), portable/handheld game/music/video player/console devices (e.g., IPOD TOUCH, MP3 players, NINTENDO SWITCH, PLAYSTATION PORTABLE, etc.), touch tables, and walls (e.g., where an image is projected through acrylic and/or glass, and the image is then backlit with LEDs).

Some or all of the operations performed by the computer 1002 according to the computer program 1010 instructions may be implemented in a special purpose processor 1004B. In this embodiment, some or all of the computer program 1010 instructions may be implemented via firmware instructions stored in a read only memory (ROM), a programmable read only memory (PROM) or flash memory within the special purpose processor 1004B or in memory 1006. The special purpose processor 1004B may also be hardwired through circuit design to perform some or all of the operations to implement the present invention. Further, the special purpose processor 1004B may be a hybrid processor, which includes dedicated circuitry for performing a subset of functions, and other circuits for performing more general functions such as responding to computer program 1010 instructions. In one embodiment, the special purpose processor 1004B is an application specific integrated circuit (ASIC).

The computer 1002 may also implement a compiler 1012 that allows an application or computer program 1010 written in a programming language such as C, C++, Assembly, SQL, PYTHON, PROLOG, MATLAB, RUBY, RAILS, HASKELL, or other language to be translated into processor 1004 readable code. Alternatively, the compiler 1012 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 1010 accesses and manipulates data accepted from I/O devices and stored in the memory 1006 of the computer 1002 using the relationships and logic that were generated using the compiler 1012.

The computer 1002 also optionally comprises an external communication device such as a modem, satellite link, Ethernet card, or other device for accepting input from, and providing output to, other computers 1002.

In one embodiment, instructions implementing the operating system 1008, the computer program 1010, and the compiler 1012 are tangibly embodied in a non-transitory computer-readable medium, e.g., data storage device 1020, which could include one or more fixed or removable data storage devices, such as a zip drive, floppy disc drive 1024, hard drive, CD-ROM drive, tape drive, etc. Further, the operating system 1008 and the computer program 1010 are comprised of computer program 1010 instructions which, when accessed, read and executed by the computer 1002, cause the computer 1002 to perform the steps necessary to implement and/or use the present invention or to load the program of instructions into a memory 1006, thus creating a special purpose data structure causing the computer 1002 to operate as a specially programmed computer executing the method steps described herein. Computer program 1010 and/or operating instructions may also be tangibly embodied in memory 1006 and/or data communications devices 1030, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 1002.

Figure 11:
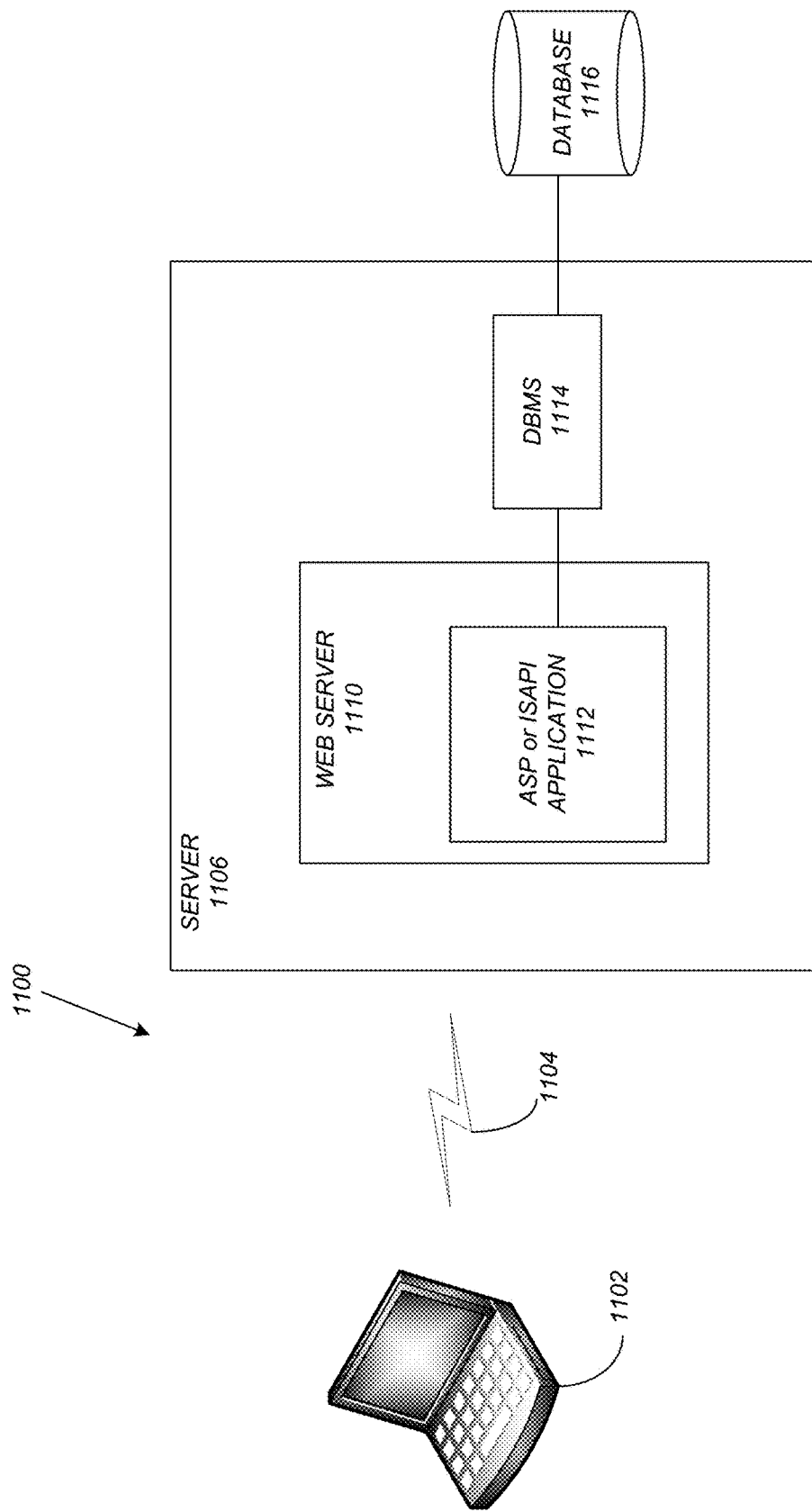
FIG. 11 schematically illustrates a typical distributed/cloud-based computer system using a network to connect client computers to server computers in accordance with one or more embodiments of the invention.

FIG. 11 schematically illustrates a typical distributed/cloud-based computer system 1100 using a network 1104 to connect client computers 1102 to server computers 1106. A typical combination of resources may include a network 1104 comprising the Internet, LANs (local area networks), WANs (wide area networks), SNA (systems network architecture) networks, or the like, clients 1102 that are personal computers or workstations (as set forth in FIG. 10), and servers 1106 that are personal computers, workstations, minicomputers, or mainframes (as set forth in FIG. 10). However, it may be noted that different networks such as a cellular network (e.g., GSM [global system for mobile communications] or otherwise), a satellite based network, or any other type of network may be used to connect clients 1102 and servers 1106 in accordance with embodiments of the invention.

A network 1104 such as the Internet connects clients 1102 to server computers 1106. Network 1104 may utilize ethernet, coaxial cable, wireless communications, radio frequency (RF), etc. to connect and provide the communication between clients 1102 and servers 1106. Further, in a cloud-based computing system, resources (e.g., storage, processors, applications, memory, infrastructure, etc.) in clients 1102 and server computers 1106 may be shared by clients 1102, server computers 1106, and users across one or more networks. Resources may be shared by multiple users and can be dynamically reallocated per demand. In this regard, cloud computing may be referred to as a model for enabling access to a shared pool of configurable computing resources.

Clients 1102 may execute a client application or web browser and communicate with server computers 1106 executing web servers 1110. Such a web browser is typically a program such as MICROSOFT INTERNET EXPLORER/EDGE, MOZILLA FIREFOX, OPERA, APPLE SAFARI, GOOGLE CHROME, etc. Further, the software executing on clients 1102 may be downloaded from server computer 1106 to client computers 1102 and installed as a plug-in or ACTIVEX control of a web browser. Accordingly, clients 1102 may utilize ACTIVEX components/component object model (COM) or distributed COM (DCOM) components to provide a user interface on a display of client 1102. The web server 1110 is typically a program such as MICROSOFT'S INTERNET INFORMATION SERVER.

Web server 1110 may host an Active Server Page (ASP) or Internet Server Application Programming Interface (ISAPI) application 1112, which may be executing scripts. The scripts invoke objects that execute business logic (referred to as business objects). The business objects then manipulate data in database 1116 through a database management system (DBMS) 1114. Alternatively, database 1116 may be part of, or connected directly to, client 1102 instead of communicating/obtaining the information from database 1116 across network 1104. When a developer encapsulates the business functionality into objects, the system may be referred to as a component object model (COM) system. Accordingly, the scripts executing on web server 1110 (and/or application 1112) invoke COM objects that implement the business logic. Further, server 1106 may utilize MICROSOFT'S TRANSACTION SERVER (MTS) to access required data stored in database 1116 via an interface such as ADO (Active Data Objects), OLE DB (Object Linking and Embedding DataBase), or ODBC (Open DataBase Connectivity).

Generally, these components 1100-1116 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 1102 and 1106 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 1102 and 1106. Embodiments of the invention are implemented as a software/CAD application on a client 1102 or server computer 1106. Further, as described above, the client 1102 or server computer 1106 may comprise a thin client device or a portable device that has a multi-touch-based display.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention. In summary, embodiments of the invention provide a process and workflow that generates a shelled generative and additive design that is based on a generative outcome that has been optimized for a particular material with a particular safety factor (e.g., not based on a hollow optimized design). The shelled design is based on a solid section size optimized design with an adjusted safety factor that compensates for a larger section size with a particular continuous wall thickness.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for generating models, comprising:

generatively creating, until convergence is reached via a generative design process within a generative design software application, a generative shelled base, wherein the generative shelled base comprises a hollow computer-aided design (CAD) three-dimensional (3D) design;

creating, from the generative shelled base, a shell CAD geometry and a shell mesh model;

creating, from the shell CAD geometry, a support structure mid-surface shell of an internal support structure for the generative shelled base;

combining the support structure mid-surface shell with the shell mesh model into a generative mid-surface mesh;

providing the generative-mid-surface mesh to a computer-aided engineering (CAE) crash simulation application for validation of the generative mid-surface mesh;
combining the generative shelled base with the shell CAD geometry into a generative shelled solid; and
providing the generative shelled solid to an additive build simulation application; and
wherein the shell CAD geometry is used to create both the generative mid-surface mesh that is used by CAE crash simulation application, and the generative shelled solid that is used by the additive build simulation application.

2. The computer-implemented method of claim 1, wherein the creating the generative shelled base comprises:
creating a generative design for a solid CAD design, wherein the creating the generative design comprises creating obstacles and applying boundary conditions with constraints;
generating one or more outcomes based on the generative design, wherein the one or more outcomes:
comprise a historical recipe for creating the generative design; and
are based on stress forces that are applied to the generative design;
analyzing the one or more outcomes and the generative design, wherein the analyzing comprises adding a t-spline to the historical recipe;
calculating a safety factor for the generative design based on the historical recipe; and
iterating the creating the generative design by adjusting the safety factor until an optimized generative shelled base is acquired.

3. The computer-implemented method of claim 2, wherein the creating the generative shelled base is performed by a solver that generates a t-spline of the generative shelled base in a uniform thickness.

4. The computer-implemented method of claim 1, wherein the internal support structure does not trap powder and is shaped to provide inertia against bending.

5. The computer-implemented method of claim 1, wherein the shell CAD geometry is created by:
creating, from the generative shelled base, a t-spline body, wherein the creating the t-spline solid body comprises:
acquiring an outer t-spline face from the generative shelled base; and
offsetting the outer t-spline face by a defined thickness to create an inner surface resulting in the t-spline solid body.

6. The computer-implemented method of claim 1, wherein the creating the shell mesh model comprises:
creating, from the generative shelled base, a t-spline mid-surface shell, wherein the creating of the t-spline mid-surface shell comprises:
acquiring an outer t-spline face from the generative shelled base; and
offsetting the outer t-spline face by a defined thickness to create an inner surface resulting in the t-spline mid-surface shell.

7. The computer-implemented method of claim 1, wherein the combining the support structure mid-surface shell with the shell mesh model comprises a Boolean operation.

8. The computer-implemented method of claim 1, wherein the combining the generated shelled base with the shell CAD geometry comprises a Boolean operation.

9. The computer-implemented method of claim 1, wherein the combining the support structure mid-surface shell with the shell mesh model further comprises:
intersecting an internal support structure, of the generative shelled base, with a face of the shell mesh model; and
deleting a portion of the internal support structure that extends beyond the face.

10. A computer-implemented system for generating models, comprising:
(a) a computer having a memory;
(b) a processor executing on the computer;
(c) the memory storing a set of instructions, wherein the set of instructions, when executed by the processor cause the processor to perform operations comprising:
(i) generatively creating, until convergence is reached, a generative shelled base, wherein the generative shelled base comprises a hollow computer-aided design (CAD) three-dimensional (3D) design;
(ii) creating, from the generative shelled base, a shell CAD geometry and a shell mesh model;
(vii) creating, from the shell CAD geometry, a support structure mid-surface shell of an internal support structure for the generate shelled base;
(viii) combining the support structure mid-surface shell with the shell mesh model into a generative mid-surface mesh, and providing the generative-mid-surface mesh to a computer-aided engineering (CAE) crash simulation application for the validation of the generate mid-surface mesh; and
(ix) combining the generative shelled base with the shell CAD geometry into a generative shelled solid, and providing the generative shelled solid to an additive build simulation application; and
wherein the shell CAD geometry is used to create both the generative mid-surface mesh that is used by CAE crash simulation application, and the generative shelled solid that is used by the additive build simulation application.

11. The computer-implemented system of claim 10, wherein the creating the generative shelled base comprises:
creating a generative design for a solid CAD design, wherein the creating the generative design comprises creating obstacles and applying boundary conditions with constraints;
generating one or more outcomes based on the generative design, wherein the one or more outcomes:
comprise a historical recipe for creating the generative design; and
are based on stress forces that are applied to the generative design;
analyzing the one or more outcomes and the generative design, wherein the analyzing comprises adding a t-spline to the historical recipe;
calculating a safety factor for the generative design based on the historical recipe; and
iterating the creating the generative design by adjusting the safety factor until an optimized generative shelled base is acquired.

12. The computer-implemented system of claim 11, wherein the creating the generative shelled base is performed by a solver that generates a t-spline of the generative shelled base in a uniform thickness.

13. The computer-implemented system of claim 10, wherein the internal support structure comprises does not trap powder and is shaped to provide inertia against bending.

14. The computer-implemented system of claim 10, wherein the shell CAD geometry is created by:
   creating, from the generative shelled base, a t-spline body, wherein the creating the t-spline solid body comprises:
   acquiring an outer t-spline face from the generative shelled base; and
   offsetting the outer t-spline face by a defined thickness to create an inner surface resulting in the t-spline solid body.

15. The computer-implemented system of claim 10, wherein the creating the shell mesh model comprises:
   creating from the generative shelled base, a t-spline mid-surface shell, wherein the creating the t-spline mid-surface shell comprises:
   acquiring an outer t-spline face from the generative shelled base; and
   offsetting the outer t-spline face by a defined thickness to create an inner surface resulting in the t-spline mid-surface shell.

16. The computer-implemented system of claim 10, wherein the combining the support structure mid-surface shell with the shell mesh model comprises a Boolean operation.

17. The computer-implemented system of claim 10, wherein the combining the generated shelled base with the shell CAD geometry comprises a Boolean operation.

18. The computer-implemented system of claim 10, wherein the combining the support structure mid-surface shell with the shell mesh model further comprises:
   intersecting an internal support structure, of the generative shelled base, with a face of the shell mesh model; and
   deleting a portion of the internal support structure that extends beyond the face.

* * * * *